(12) United States Patent
Khieu et al.

(10) Patent No.: US 9,948,212 B2
(45) Date of Patent: Apr. 17, 2018

(54) METHOD AND TECHNIQUE TO CONTROL MEMS DVC CONTROL WAVEFORM FOR LIFETIME ENHANCEMENT

(71) Applicant: CAVENDISH KINETICS, INC., San Jose, CA (US)

(72) Inventors: Cong Quoc Khieu, San Jose, CA (US); James Douglas Huffman, McKinney, TX (US); Richard L. Knipe, McKinney, TX (US); Vikram Joshi, Mountain View, CA (US); Robertus Petrus Van Kampen, S-Hertogenbosch (NL)

(73) Assignee: CAVENDISH KINETICS, INC., San Jose, CA (US)

( * ) Notice: Subject to any disclaimer, the term of this patent is extended or adjusted under 35 U.S.C. 154(b) by 0 days.

(21) Appl. No.: 14/889,118

(22) PCT Filed: May 16, 2014

(86) PCT No.: PCT/US2014/038323
§ 371 (c)(1),
(2) Date: Nov. 4, 2015

(87) PCT Pub. No.: WO2014/186656
PCT Pub. Date: Nov. 20, 2014

(65) Prior Publication Data
US 2016/0072408 A1 Mar. 10, 2016

Related U.S. Application Data

(60) Provisional application No. 61/824,625, filed on May 17, 2013.

(51) Int. Cl.
*H02N 1/00* (2006.01)
*B81B 7/00* (2006.01)
(Continued)

(52) U.S. Cl.
CPC ............. *H02N 1/006* (2013.01); *B81B 7/008* (2013.01); *B81B 7/02* (2013.01); *H01G 5/011* (2013.01);
(Continued)

(58) Field of Classification Search
CPC ... B81B 2201/0221; B81B 7/008; B81B 7/02; H03J 2200/39
See application file for complete search history.

(56) References Cited

U.S. PATENT DOCUMENTS 6,414,873 B1 * 7/2002 Herdt ..................... G11C 14/00
365/154
8,446,211 B2 * 5/2013 Lee ......................... H02M 3/07
327/536

(Continued)

FOREIGN PATENT DOCUMENTS

CN 102447419 A 5/2012
JP 2005-055484 A 3/2005

(Continued)

OTHER PUBLICATIONS

JP 2011-124382; a variable capacity condenser; Jun. 2, 2011.*

(Continued)

*Primary Examiner* — Shawki S Ismail
*Assistant Examiner* — Muhammad S Islam
(74) *Attorney, Agent, or Firm* — Patterson + Sheridan, LLP; Steven H. VerSteeg

(57) ABSTRACT

The present invention generally relates to a method of operating a MEMS DVC while minimizing impact of the MEMS device on contact surfaces. By reducing the drive voltage upon the pull-in movement of the MEMS device, the acceleration of the MEMS device towards the contact surface is reduced and thus, the impact velocity is reduced and less damage of the MEMS DVC device occurs.

20 Claims, 10 Drawing Sheets

(51) Int. Cl.
*H01G 5/18* (2006.01)
*H01H 59/00* (2006.01)
*B81B 7/02* (2006.01)
*H01G 5/011* (2006.01)

(52) U.S. Cl.
CPC .......... *H01G 5/18* (2013.01); *H01H 59/0009* (2013.01); *B81B 2201/0221* (2013.01); *H03J 2200/39* (2013.01)

(56) References Cited

U.S. PATENT DOCUMENTS

| | | |
|---|---|---|
| 2006/0066931 A1 | 3/2006 | Ogikubo et al. |
| 2007/0007849 A1 | 1/2007 | Ogikubo et al. |
| 2007/0024951 A1* | 2/2007 | Mochizuki ......... G02B 26/0841 359/291 |
| 2010/0127764 A1 | 5/2010 | Suzuki |
| 2010/0238600 A1* | 9/2010 | Miyazaki ........... H01H 59/0009 361/211 |
| 2011/0002168 A1* | 1/2011 | Schepens ........... G11C 14/0054 365/185.08 |
| 2012/0086367 A1 | 4/2012 | Iyad Al Dibs et al. |
| 2014/0055908 A1* | 2/2014 | Murata ................... H01G 5/16 361/290 |

FOREIGN PATENT DOCUMENTS

| | | |
|---|---|---|
| JP | 2006-136162 A | 5/2006 |
| JP | 2008-218400 A | 9/2008 |
| WO | 2007043006 A2 | 4/2007 |
| WO | 2010/049865 A1 | 5/2010 |
| WO | 2013033613 A2 | 3/2013 |

OTHER PUBLICATIONS

MEMS Switch With Reduced Impact Stress,WO 2010/049865 (International Publication Date May 6, 2010 (May 6, 2010)).*
Chinese Office Action (with attached English translation) for Application No. 201480028457.1, dated Jul. 1, 2016; 22 total pages.
Chinese Office Action dated Nov. 25, 2016 for Chinese Patent Application No. 201480028457.1.
Japanese Office Action (with attached English translation) for Application No. 2016-514109; dated Jan. 26, 2018; 8 total pages.

* cited by examiner

METHOD AND TECHNIQUE TO CONTROL MEMS DVC CONTROL WAVEFORM FOR LIFETIME ENHANCEMENT

BACKGROUND OF THE INVENTION

Field of the Invention

Embodiments of the present invention generally relate to a method to lessen the impact of a switch in a micro electromechanical system (MEMS) device.

Description of the Related Art

A digital variable capacitor (DVC) operates with electrostatic forces. In this mechanism, a force is acting on the moveable MEMS device when a voltage V is applied between the MEMS device and a control electrode. This electrostatic force scales with $(V/gap)^2$. The mechanical counter-balance force comes from a spring suspension system and typically scales linearly with the displacement. The result is that with an increasing voltage V the MEMS device moves a certain distance δ toward the control-electrode. This movement reduces the gap which in turn increases the electrostatic force further. For small voltages, an equilibrium position between the initial position and the electrode is found. However, when the voltage exceeds a certain threshold level (i.e., the pull-in voltage), the device displacement is such that the electrostatic force rises faster than the mechanical counterbalance force and the device rapidly snaps-in (i.e., moves) towards the control-electrode until it comes in contact with a contact surface.

Some DVC devices have a control-electrode above (i.e., a pull-up or pull-off or PU-electrode) and below (i.e., a pull-down or pull-in or PD-electrode) the moveable MEMS device (i.e., the plate in FIG. 1), as shown schematically in FIG. 1. In addition there is an RF-electrode below the moveable MEMS device. During operation the MEMS device is either pulled-up or pulled-down in contact to provide a stable minimum or maximum capacitance to the RF-electrode. In this way the capacitance from the moveable device to the RF-electrode (which resides below the moveable device) can be varied from a high capacitance $C_{max}$ when pulled to the bottom, as shown in FIG. 2, to a low capacitance $C_{min}$ when pulled to the top, as shown in FIG. 3.

In production, the MEMS devices will exhibit a variation in pull-in voltages due to manufacturing tolerances, such as layer thicknesses and stress levels. In addition, some MEMS devices require a certain overvoltage beyond the pull-in voltage to be applied to the pull-in electrode to provide for a stable capacitance. Additionally, the CMOS controller will exhibit some variation in the available voltage levels due to manufacturing tolerances as well. As a result, the voltage levels applied to the pull-electrodes are typically designed such to provide for enough margin against manufacturing tolerances.

If this high voltage level is applied to the pull-in electrode very quickly, the MEMS device will rush towards the pull-in electrode very quickly because the MEMS device immediately sees an electrostatic force much larger than required for pull-in. This will lead to an acceleration of the MEMS device towards the pull-electrode from the start and result in a high impact velocity causing damage to the contact surfaces.

Therefore, there is a need in the art for reducing the impact of the MEMS devices on the contact surfaces.

SUMMARY OF THE INVENTION

The present invention generally relates to a method of operating a MEMS DVC while minimizing impact of the MEMS device on contact surfaces. By reducing the drive voltage upon the pull-in movement of the MEMS device, the acceleration of the MEMS device towards the contact surface is reduced and thus, the impact velocity is reduced and less damage of the MEMS DVC device occurs.

In one embodiment, a method of operating a MEMS DVC device comprises: applying a first voltage to an electrode for a first period of time; increasing the first voltage to a second voltage, wherein the increasing occurs for a second period of time; decreasing the second voltage to a third voltage, wherein the decreasing occurs for a third period of time; and increasing the third voltage to a fourth voltage, wherein the increasing occurs for a fourth period of time.

In another embodiment, a MEMS DVC device comprises: a first electrode having a first dielectric layer disposed thereover and having a first contact surface; a second electrode having a second dielectric layer disposed thereover and having a second contact surface; a MEMS device movable between the first contact surface and a second contact surface; and a first electrode voltage driver coupled to either the first electrode or the second electrode. The first electrode voltage controller is configured to: apply a first voltage to either the first electrode or the second electrode for a first period of time; increase the first voltage to a second voltage, wherein the increasing occurs for a second period of time; decrease the second voltage to a third voltage, wherein the decreasing occurs for a third period of time; and increase the third voltage to a fourth voltage, wherein the increasing occurs for a fourth period of time.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to a method of operating a MEMS DVC while minimizing impact of the MEMS device on contact surfaces. By reducing the drive voltage upon the pull-in movement of the MEMS device, the acceleration of the MEMS device towards the contact surface is reduced and thus, the impact velocity is reduced and less damage of the MEMS DVC device occurs.

MEMS DVCs show superior performance improvement over other mature technologies such as silicon or GaAs technology but still haven't been used widely in many applications because of various issues. One issue, the MEMS lifetime, can be improved by the MEMS structure itself or by the waveforms that control the MEMS. The MEMS device is moved by applying a voltage to an electrode. The voltage applied needs to be high enough to move the MEMS device. If the high voltage is applied to the pull-in electrode very quickly, the MEMS device will rush towards the pull-in electrode very quickly because the MEMS device immediately sees an electrostatic force much larger than required for pull-in. This will lead to an acceleration of the MEMS device towards the pull-in electrode from the start and results in a high impact velocity causing damage to the contact surfaces.

Figure 1:
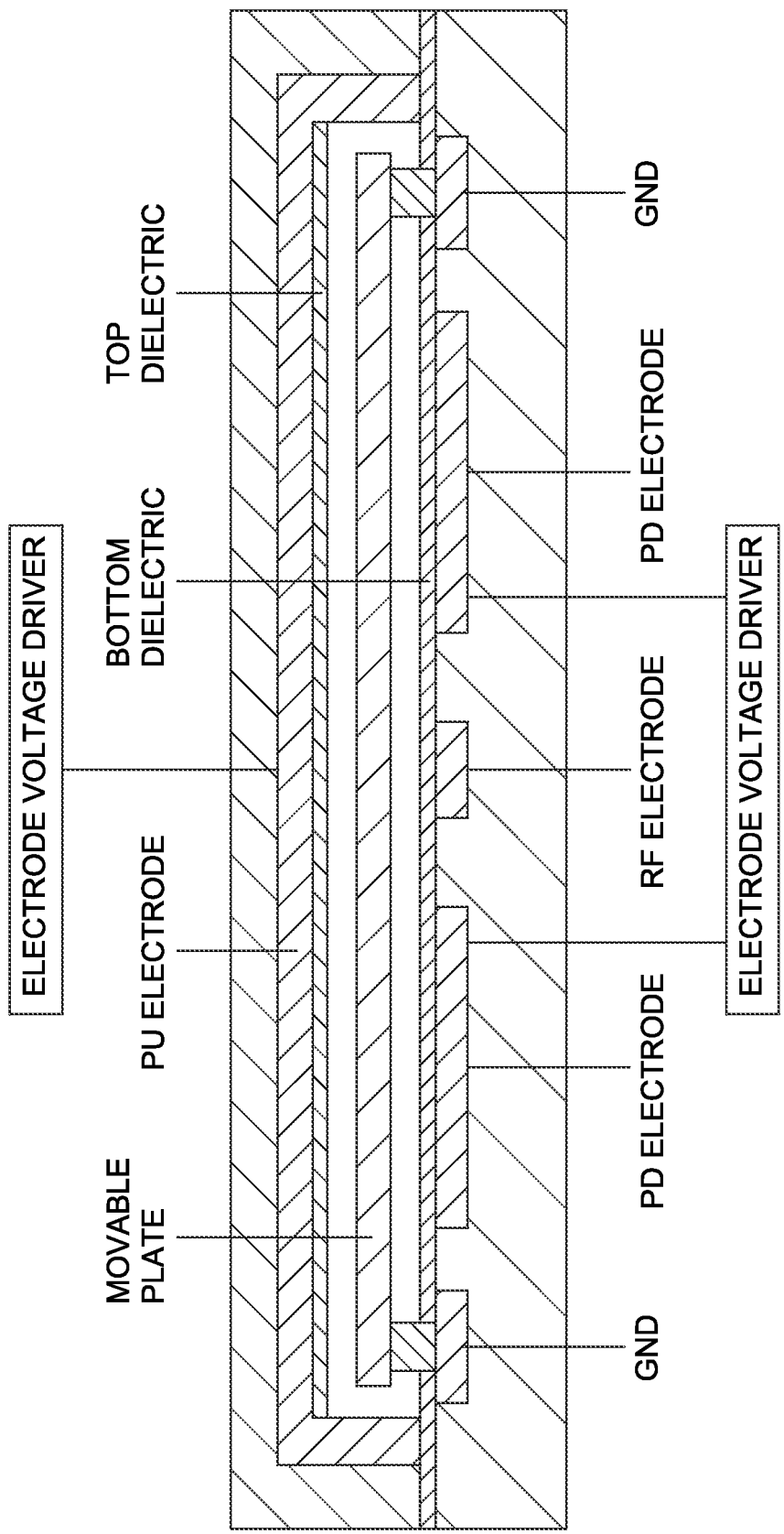
FIG. 1 is a schematic cross-sectional illustration of a MEMS device of a DVC in the free-standing state.
Figure 2:
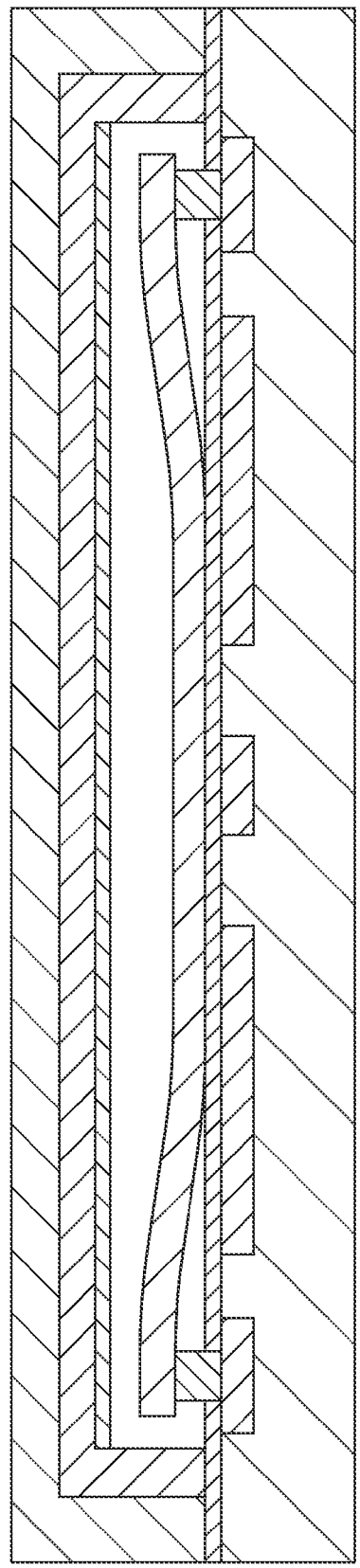
FIG. 2 is a schematic cross-sectional illustration of a MEMS device of a DVC in the $C_{max}$ state.
Figure 3:
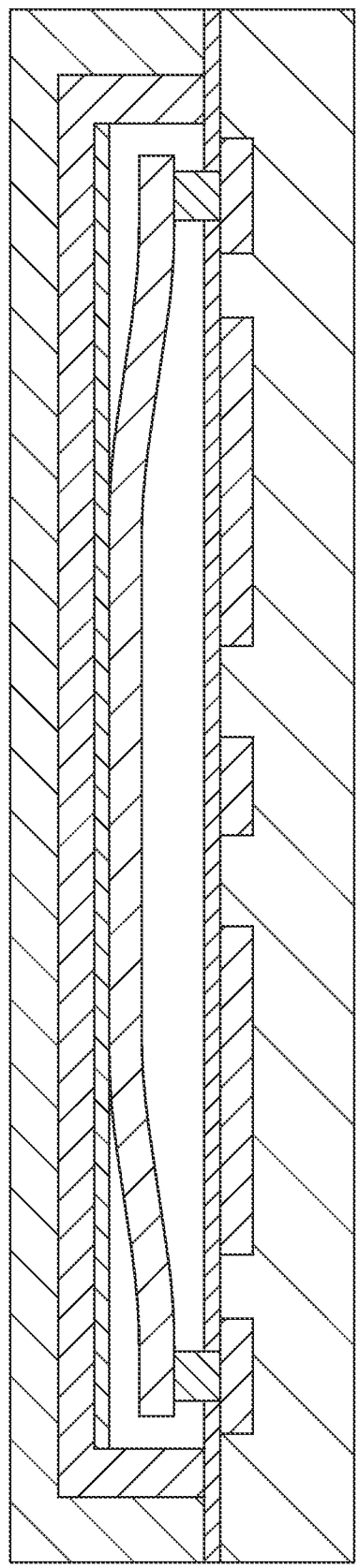
FIG. 3 is a schematic cross-sectional illustration of a MEMS device of a DVC in the $C_{min}$ state.
Figure 4:
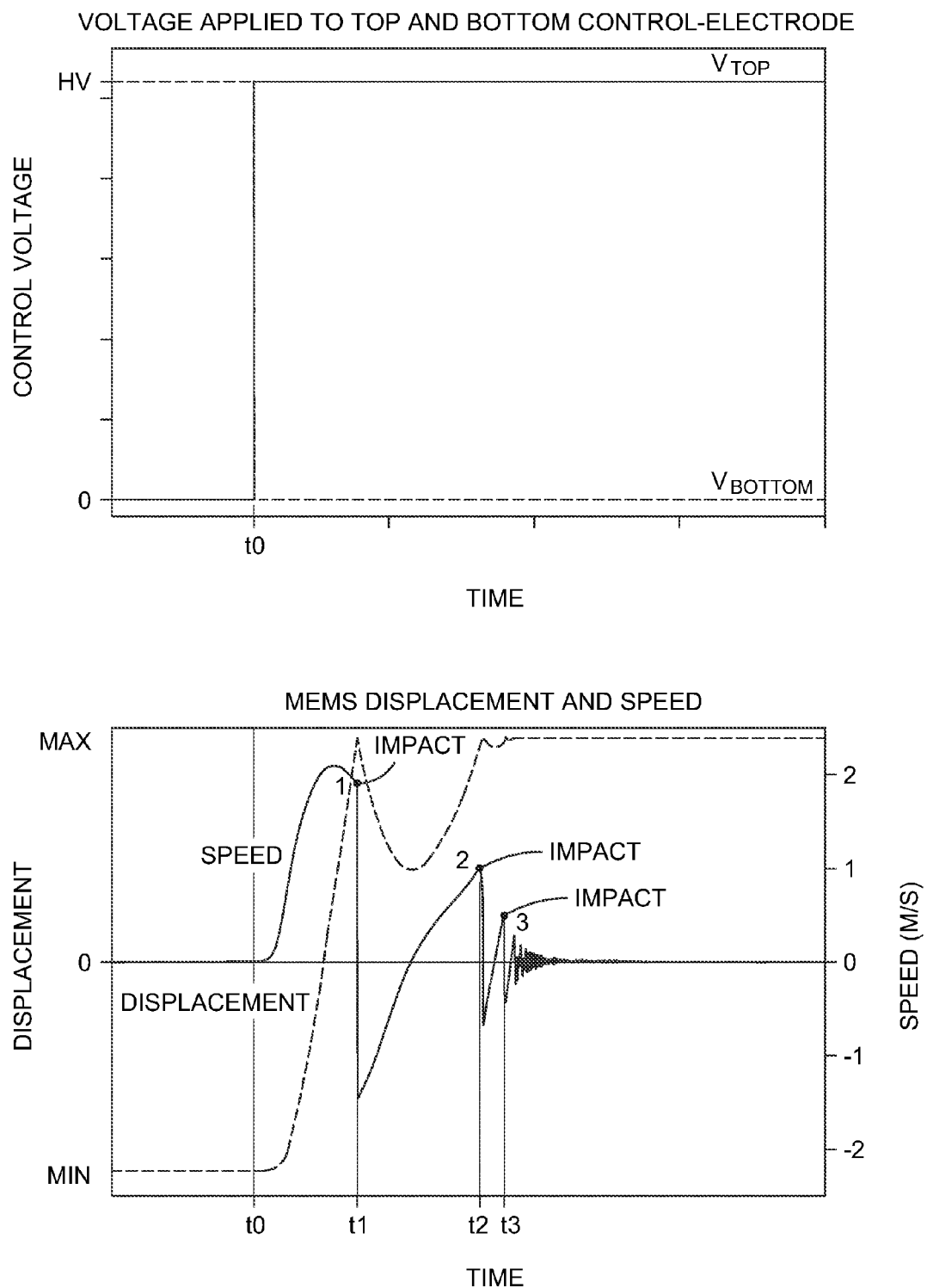
FIG. 4 shows graphs illustrating the impact speed for a fast-voltage-ramp driven DVC device.

This is shown in FIG. 4, where the MEMS DVC device is initially landed on the bottom by a control-voltage Vbottom=HV and Vtop=0V. At t=t0 the bottom voltage is released and the top-voltage Vtop is applied (Vbottom=0V, Vtop=HV). The device immediately accelerates to the top until it hits the top-electrode, where it bounces several times at t=t1, t2, t3 with an initial impact speed of ~2 m/s. For a MEMS device, this impact speed can lead to structural damage of the contact surfaces which greatly affects the lifetime.

Figure 5:
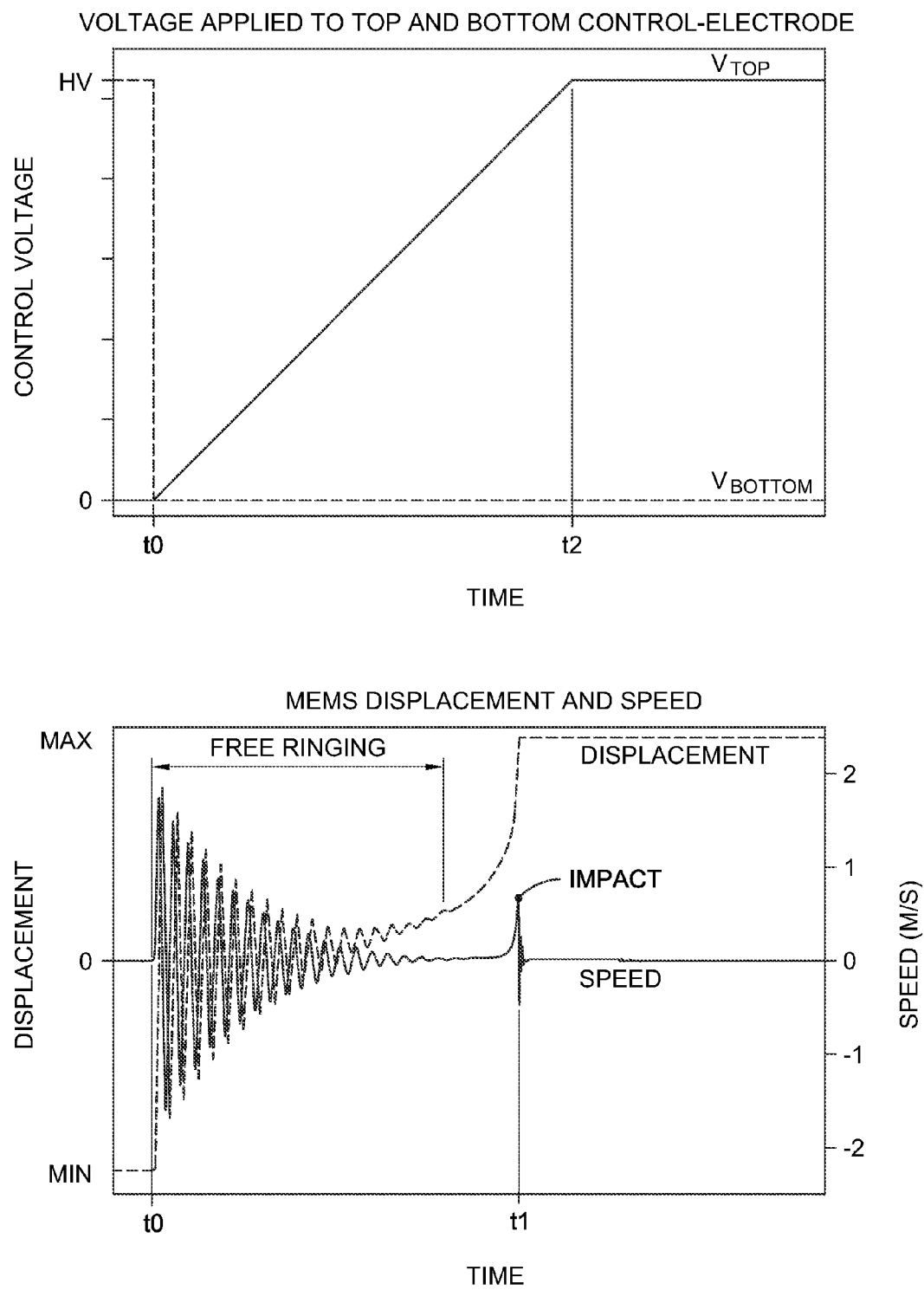
FIG. 5 shows graphs illustrating the impact speed for a slow-voltage-ramp driven DVC device.

One voltage driven solution with slight improvement is shown in FIG. 5, where the MEMS DVC device is also initially landed on the bottom by a control-voltage Vbottom=HV and Vtop=0V. At t=t0 the bottom voltage is released (Vbot=0V) and the top-voltage Vtop is slowly ramped from 0 to HV (the time-scale of this figure is larger than the time-scale of FIG. 4). As soon as the device is released from the bottom electrode it freely rings while the top control-voltage is ramped. The rate at which the ringing dies out depends on the Q of the MEMS device which is related to pressure inside the cavity (squeeze-film damping) and losses inside the MEMS device itself. The device pulls-in to the top-electrode at t=t1 when the voltage has reached the required pull-in voltage level. Because there is not much over-drive at this point, the impact speed is reduced to ~0.6 m/s. The voltage continues to ramp and has reached its final value at t=t2. Although the control scheme is already improved from the fast-voltage-driven scheme of FIG. 4 this impact speed is still quite high and can lead to a structural damage of the contac surfaces which leads to early lifetime failures.

As discussed herein, reducing the drive voltage upon the pull-in movement of the MEMS device reduces the acceleration of the MEMS device towards the contact surface and thus, reduces the impact speed. The main advantage of reducing the drive voltage upon the pull-in movement of the MEMS device is to significantly improve MEMS yield and lifetime. Reducing the drive voltage reduces the impact damage on the contact surfaces. Without the waveform (i.e., the reduction in drive voltage), the MEMS devices can cycle only a few million cycles. With the lifetime enhanced waveforms, the MEMS devices can cycle several billion cycles without loss of device performance. Another advantage is that peak currents on the control lines are reduced which reduces noise in the system and puts less strict requirements on the power budget of the circuit design.

As discussed herein, a variation of the slow-voltage-ramp driven scheme mentioned above is utilized. In addition to the slow-voltage ramp, the drive voltage is drastically reduced upon snap-in of the MEMS device by a self-controlled mechanism. The reduction in voltage reduces the acceleration of the MEMS device towards the electrode and results in a drastically reduced impact speed.

When the MEMS device moves, the capacitance between the MEMS device and the control electrode is modulated. As a result, the current flowing though the control-capacitor which needs to be provided by the controller is modulated as well:

$$i = \frac{dQ}{dt} = \frac{d(C*V)}{dt} = C*\frac{dV}{dt} + V*\frac{dC}{dt}$$

In a standard capacitor the current is only given by $C*dV/dt$. However, because the capacitor is being modulated over time an additional current $V*dC/dt$ is required. Upon snap-in (i.e., movement) of the MEMS device, the capacitance rapidly increases and the required current to be supplied by the controller increases exponentially. By limiting the current that the controller can deliver, the actual voltage on the electrode is reduced on snap-in.

Figure 6:
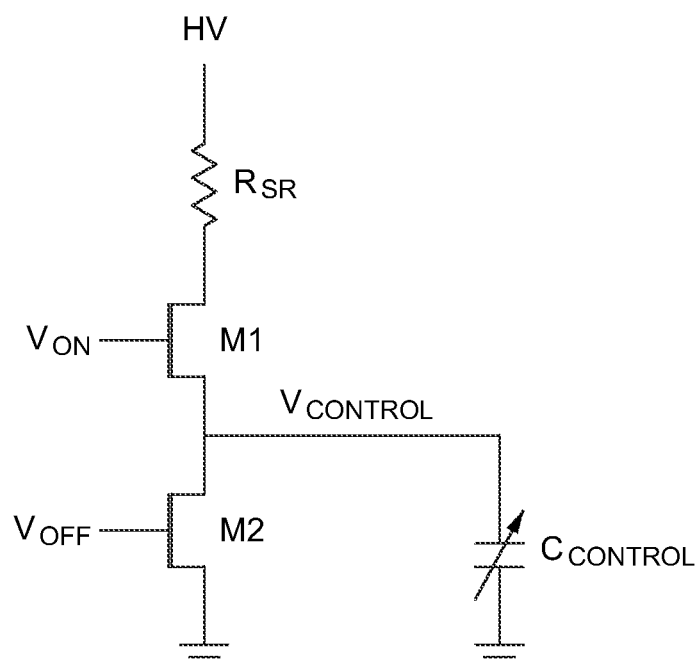
FIG. 6 illustrates a current-starved voltage-driver using a slew-rate resistor.
Figure 7:
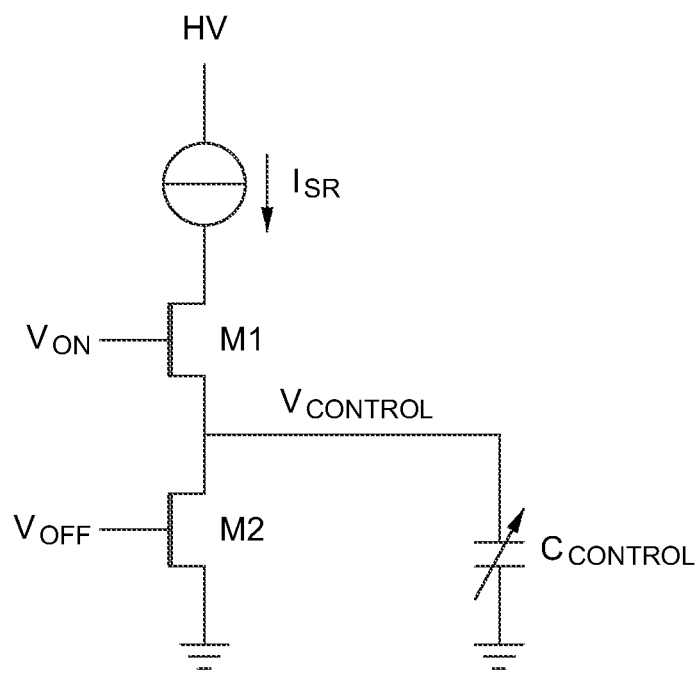
FIG. 7 illustrated a current-starved voltage-driver with a slew-rate current.

Two schematic implementations of the electrode voltage driver are shown in FIG. 6 and FIG. 7. The basic driver consists of 2 transistors: M1 to pull Vcontrol to the high voltage level HV and M2 to pull the output voltage Vcontrol to ground. Vcontrol is connected to the pull-up or pull-down electrode of the MEMS device (represented by the capacitance Ccontrol). Each MEMS DVC device has 2 of these control drivers; one connected to the pull-up and one connected to the pull-down electrode. In series with M1 is a current limiting device, either a resistor $R_{sl}$ (FIG. 6) or a slew-rate limiting current source $I_{sl}$ (FIG. 7).

When M1 is turned on, the output voltage Vcontrol slowly ramps up to HV limited by Rsl or Isl. The rise-time of the control voltage scales with Rsr*Ccontrol (FIG. 6) or Ccontrol/Isr (FIG. 7) and is controlled by selecting the appropriate value for Rsr or Isr to work in conjunction with the control capacitance of the MEMS device. When Vcontrol reaches the pull-in voltage of the MEMS device, it snaps-in and Ccontrol is increased. Because the drive-current is already slewing no more current can be delivered by the driver. As a result the voltage on the control-electrode drops (C*V=constant).

Figure 8:
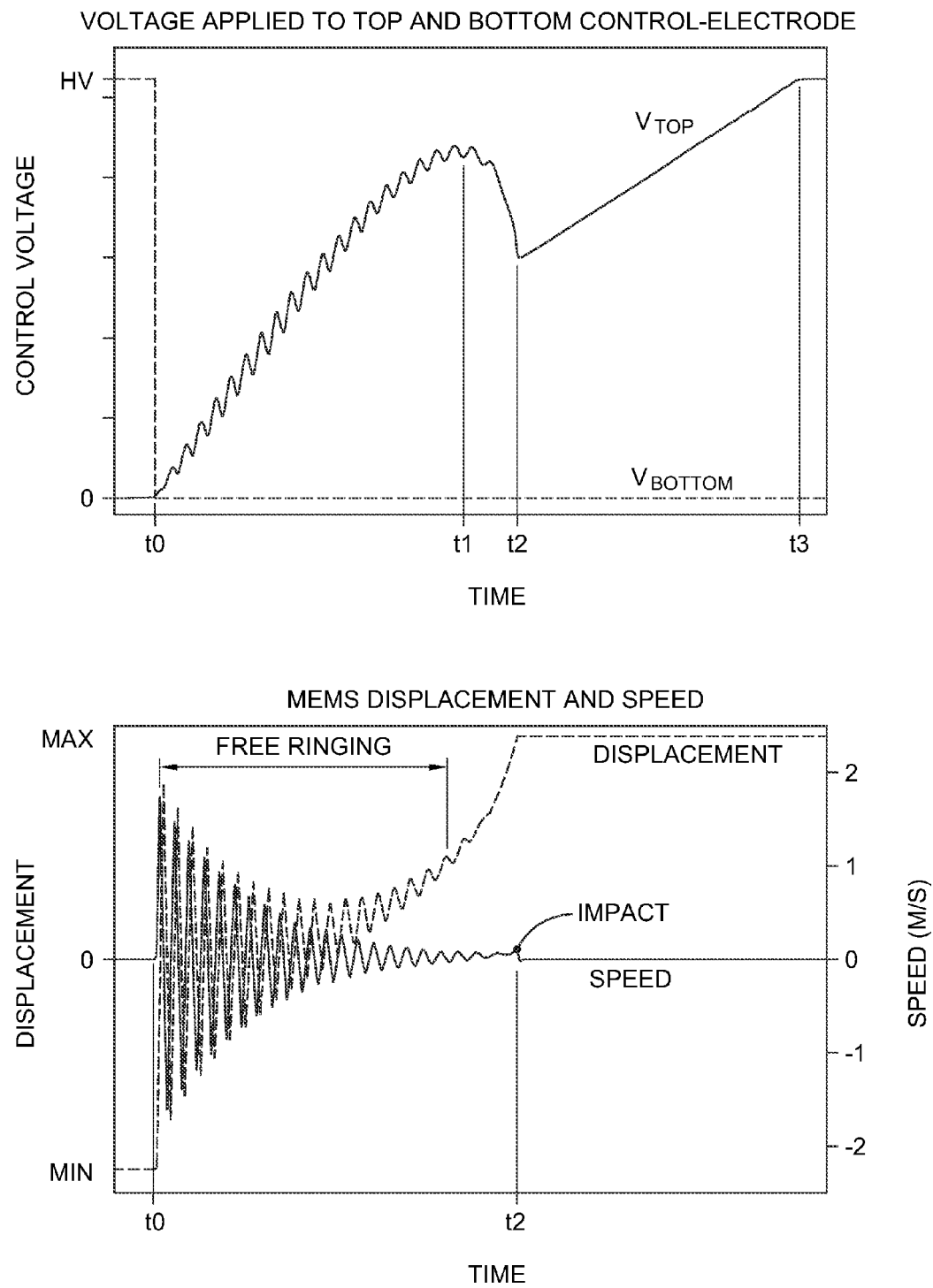
FIG. 8 shows graphs illustrating the impact speed for a current-starved voltage driven DVC device.

This can be seen in FIG. 8, where the MEMS device is initially landed on the bottom by a control-voltage Vbottom=HV and Vtop=0V. At t=t0 the bottom voltage is released (Vbot=0V) and the top-voltage Vtop is slowly ramped from 0 to HV. When the bottom voltage is released, a first voltage (i.e., the top voltage) is initially applied. As soon as the device is released from the bottom electrode it freely rings (i.e., vibrates) while the top control-voltage is being ramped (i.e., increased). This modulates the control capacitance Ccontrol. Because the control-driver is already supplying the max-current (limited by Rsr or Isr), the control capacitance modulation appears as a modulation of Vcontrol at the output of the control-driver. The rate at which the ringing dies out depends on the Q of the MEMS device which is related to pressure inside the cavity (squeeze-film damping) and losses inside the MEMS device itself.

At t=t1 the voltage reaches the pull-in voltage of the MEMS (i.e., the second voltage) and the device rapidly accelerates towards the control-electrode at a first velocity while still ringing. As a result, the control capacitance increases and because the control-driver is current starved, the control voltage drops. Because the control voltage drops (i.e., the voltage applied to the pull-up applied decreases from the second voltage to a third voltage), the MEMS device, while continuing to vibrate, continues to move towards the contact point (i.e., the dielectric layer overlying the pull-up electrode), albeit at a slower velocity. At t=t2 the MEMS device lands on the contact point and stops vibrating and because of the drop in control-voltage the electrostatic forces acting on the MEMS are reduced and the acceleration of the MEMS is reduced resulting in a greatly reduced impact speed.

After the device has landed at t=t2 and the control voltage has dropped to the third voltage, the control voltage continues to ramp up to HV (i.e., the fourth voltage). However, because the control capacitance in the landed state is higher, the voltage ramp-rate is reduced (the rise-time scales with Ccontrol). During the increase of voltage from t2 to t3, the MEMS device remains in contact with the contact point without vibrating. At t=t3 the control voltage reaches the final value HV. During the increase in voltage from the third voltage to a fourth voltage, the MEMS device is pulled into tighter contact with the contact point.

Figure 9:
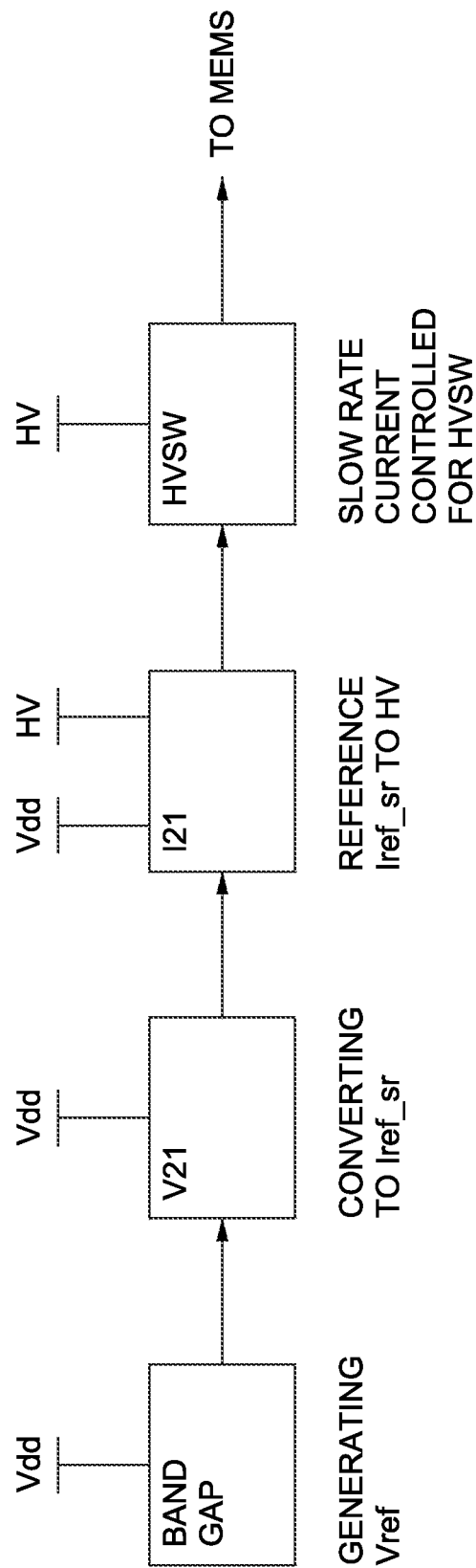
FIG. 9 is a schematic view of the circuit implementation using a current-source.

The implementation shown in FIG. 9 shows one of the possible ways that this control scheme can be implemented in a CMOS technology using LDMOS devices. The slewrate current source implementation requires providing a current mirror that is referenced to HV. FIG. 9 shows the circuit block diagram showing how the reference current is generated.

Figure 10:
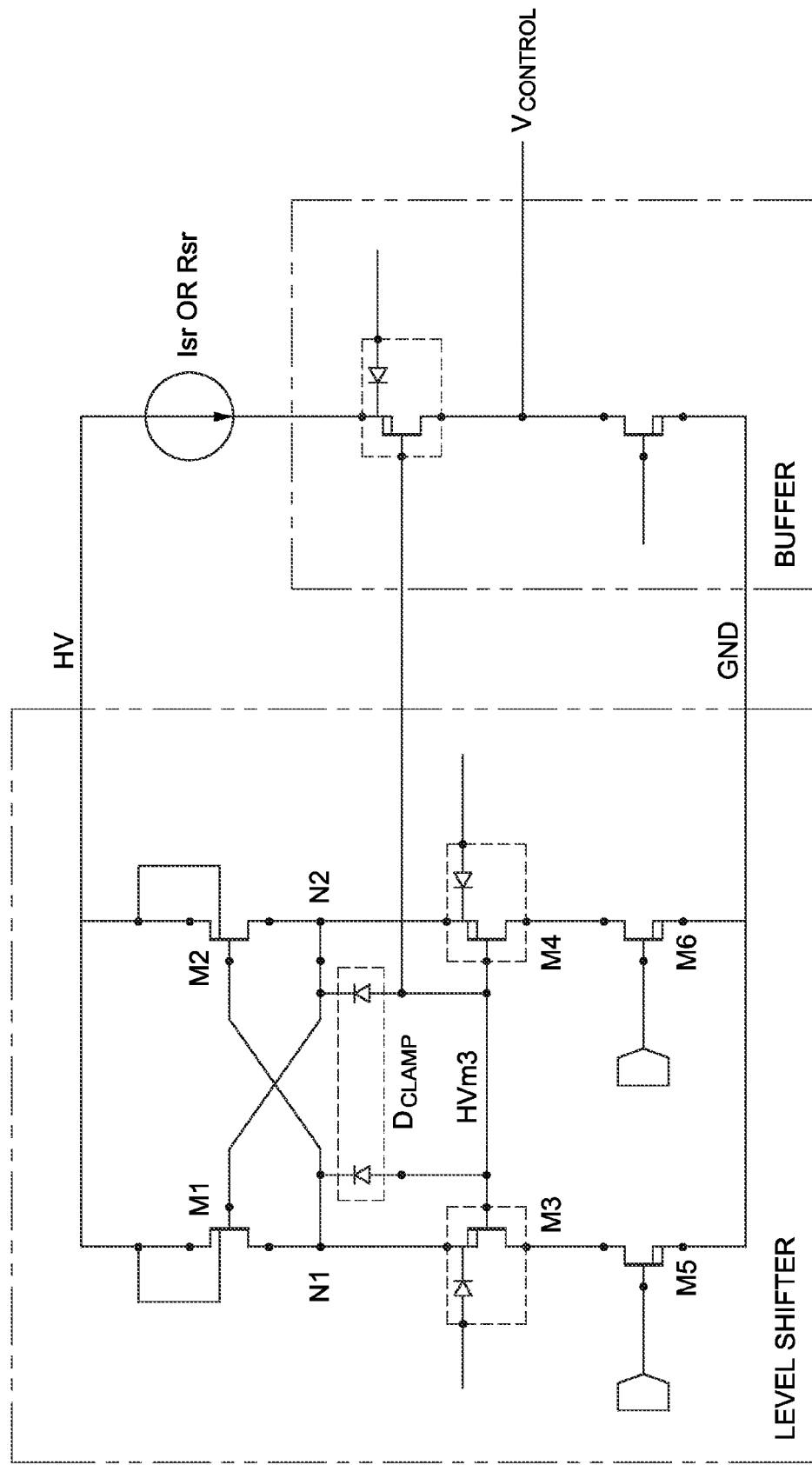
FIG. 10 illustrates a HVSW design according to one embodiment.
Figure 11:
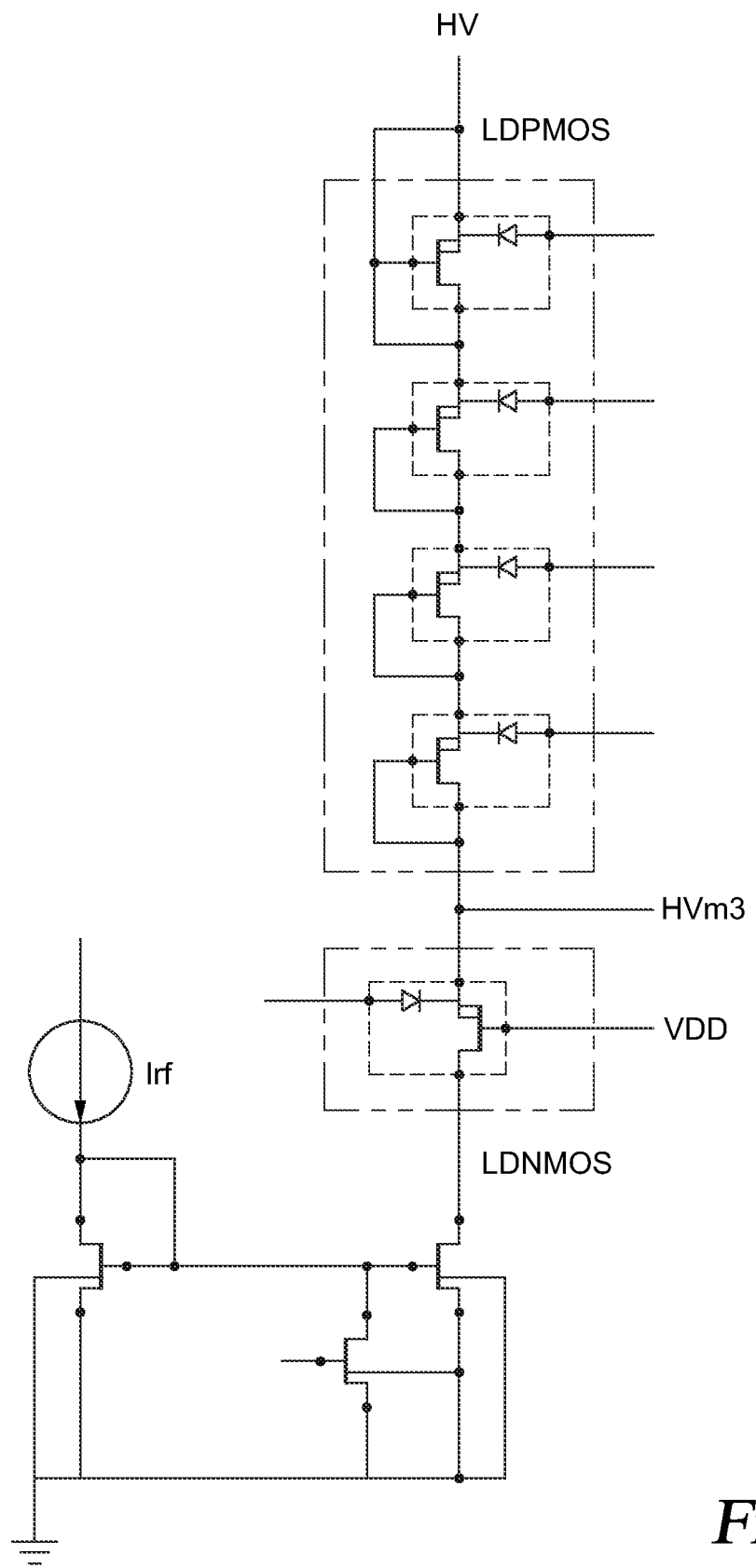
FIG. 11 illustrates a HVm3 generator according to one embodiment.

The band gap generates a very stable reference voltage over process, temperature and voltage variation (e.g., less than 10 mV over PVT). The bandgap voltage is converted into a reference current in the V2I block. The I2I-block then references this current to HV. The HVSW (High-Voltage-Switch) is the control-driver (See FIG. 7) that uses the reference current Isr to set the output slew-rate. The HVSW, shown in FIG. 10, consists of a level shifter, a buffer and an HVm3 generator. The level-shifter generates the control-signals for the buffer which operates up to HV. The output current of the buffer is either limited by the slewrate current Isr or by the slewrate resistor Rsr. In case the slewrate resistor implementation is used, the Bandgap, V2I and I2I block are not required for the HVSW. The level-shifter in FIG. 10 consists of a cross-coupled transistor pair M1, M2 driven by input transistors M5, M6. For LDMOS technology, the Vgs needs to be limited to less than typically 5V. Therefore, cascode transistors M3, M4 are added to the level-shifter between input transistors M5, M6 and the cross-coupled transistors M1, M2. The bias voltage for the cascodes is generated with the HVm3 generator shown in FIG. 11. It generates HVm3=HV−3V, which is derived from HV with a few Vgs drops across a number of series-connected LDPMOS devices (See FIG. 11). The low voltage devices in the HVm3 generator are isolated from HV with an LDNMOS with its gate connected to VDD. For a high-voltage process technology, the same circuit topology can be used for the level-shifter after removing cascode transistors M3 and M4.

To ensure that the MEMS DVC is powered up with both the pull-in and the pull-up electrodes off (i.e., the output voltage Vcontrol remains at 0V), transistor M2 may be made stronger than transistor M1 by about 10 percent. In so doing, the voltage on node N2 is latched high on start-up and this turns off the current to the HVSW buffer, preventing the voltage on Vcontrol to rise. As soon as HV and HVm3 are charged up high enough, transistor M2 will be turned on, which increases the voltage at node N2. The voltage on node N2 follows HV and this keeps M1 off (its Vgs=0V). The voltage at node N1 will remain low and M3 will be turned off. Because both M1 and M3 are off, the voltage at node N1 is undefined and can assume any value. Without the clamp diodes, the voltage on node N1 can assume a very low value which can damage transistor M1. The same is true during normal operation. Transistors M1 and M3 are off and the voltage at node N1 is undefined or transistors M2 and M4 are off and the voltage at node N2 is undefined. By adding the clamp diodes between nodes N1 and HVm3 and also between nodes N2 and HVm3, the voltages on nodes N1 and N2 will not be lower than HVm3 minus a diode voltage drop, which ensures that the voltage drop across M1 and M2 remain in a safe operating regime for these transistors.

By controlling the voltage applied to either the pull-in or pull-up electrode, the velocity with which the MEMS device impacts the contact surface may be controlled such that the MEMS device impact is lessened than would otherwise occur with a constant, high voltage. By controlling the voltage applied, the lifetime of the MEMS DVC may be increased to several billion cycles without a loss of device performance.

While the foregoing is directed to embodiments of the present invention, other and further embodiments of the invention may be devised without departing from the basic scope thereof, and the scope thereof is determined by the claims that follow.

The invention claimed is:

1. A method of operating a MEMS DVC device, comprising:
    applying a first voltage to an electrode for a first period of time;
    increasing the first voltage to a second voltage, wherein the increasing occurs for a second period of time;
    decreasing the second voltage to a third voltage, wherein the decreasing occurs for a third period of time; and
    increasing the third voltage to a fourth voltage, wherein the increasing occurs for a fourth period of time, and wherein the fourth voltage is greater than the second voltage.

2. The method of claim 1, wherein the second voltage is sufficient to cause a MEMS device to pull-in towards the electrode.

3. The method of claim 2, wherein the MEMS device continues to move towards the electrode while decreasing the second voltage to a third voltage.

4. The method of claim 3, wherein during the fourth time period, the MEMS device is pulled into more intimate contact with a dielectric layer disposed over the pull-in electrode.

5. The method of claim 4, wherein the reduction from the second voltage to the third voltage reduces the impact velocity of the MEMS device on the dielectric layer.

6. The method of claim 5, wherein during the reduction from the second voltage to the third voltage, the MEMS device vibrates.

7. The method of claim 6, wherein during increasing the first voltage to the second voltage, the MEMS device vibrates at a greater frequency than during the reduction from the second voltage to the third voltage.

8. The method of claim 7, wherein during the decreasing the second voltage to the third voltage, the MEMS device continues to move towards the electrode while vibrating.

9. The method of claim 8, wherein at the end of the third time period, the MEMS device impacts a contact surface.

10. The method of claim 9, wherein during the increasing from the first voltage to the second voltage the vibration of the MEMS device decreases.

11. A MEMS DVC device, comprising:
a first electrode having a first dielectric layer disposed thereover having first contact surface;
a second electrode having a second dielectric layer disposed thereover having a second contact surface;
a MEMS device disposed in a cavity and movable between the first contact surface and a second contact surface; and
a first electrode voltage driver coupled to either the first electrode or the second electrode, wherein the first electrode voltage driver is configured to:
apply a first voltage to either the first electrode or the second electrode for a first period of time;
increase the first voltage to a second voltage, wherein the increasing occurs for a second period of time;
decrease the second voltage to a third voltage, wherein the decreasing occurs for a third period of time; and
increase the third voltage to a fourth voltage, wherein the increasing occurs for a fourth period of time, and wherein the fourth voltage is greater than the second voltage.

12. The MEMS DVC of claim 11, wherein the first electrode voltage driver comprises:
a first transistor; and
a second transistor coupled to the first transistor at a node, wherein the node is coupled to either the first electrode or the second electrode.

13. The MEMS DVC of claim 12, further comprising a resistor coupled to the first transistor.

14. The MEMS DVC of claim 13, wherein the first electrode voltage driver is coupled to the first electrode.

15. The MEMS DVC of claim 14, further comprising a second electrode voltage driver coupled to the second electrode.

16. The MEMS DVC of claim 15, wherein the second electrode voltage driver is substantially identical to the first electrode voltage driver.

17. The MEMS DVC of claim 12, further comprising a slew-rate limiting current source coupled to the first transistor.

18. The MEMS DVC of claim 17, wherein the first electrode voltage driver is coupled to the first electrode.

19. The MEMS DVC of claim 18, further comprising a second electrode voltage driver coupled to the second electrode.

20. The MEMS DVC of claim 19, wherein the second electrode voltage driver is substantially identical to the first electrode voltage driver.

* * * * *